(12) United States Patent
Ambo et al.

(10) Patent No.: US 10,707,770 B2
(45) Date of Patent: Jul. 7, 2020

(54) ON-BOARD FLUID MACHINE

(71) Applicant: KABUSHIKI KAISHA TOYOTA JIDOSHOKKI, Kariya-shi, Aichi-ken (JP)

(72) Inventors: Shunsuke Ambo, Kariya (JP); Fumihiro Kagawa, Kariya (JP); Yoshiki Nagata, Kariya (JP)

(73) Assignee: KABUSHIKI KAISHA TOYOTA JIDOSHOKKI, Kariya-shi, Aichi-ken (JP)

(*) Notice: Subject to any disclaimer, the term of this patent is extended or adjusted under 35 U.S.C. 154(b) by 365 days.

(21) Appl. No.: 15/865,349

(22) Filed: Jan. 9, 2018

(65) Prior Publication Data

US 2018/0198350 A1    Jul. 12, 2018

(30) Foreign Application Priority Data

Jan. 12, 2017 (JP) .................... 2017-003621

(51) Int. Cl.
| | |
|---|---|
| H02M 7/00 | (2006.01) |
| H02K 11/02 | (2016.01) |
| H02K 11/33 | (2016.01) |
| H03H 7/01 | (2006.01) |
| B60H 1/32 | (2006.01) |
| H01F 27/34 | (2006.01) |
| H02M 7/537 | (2006.01) |
| H01F 17/00 | (2006.01) |

(52) U.S. Cl.
CPC .......... *H02M 7/003* (2013.01); *B60H 1/3222* (2013.01); *H01F 27/346* (2013.01); *H02K 11/02* (2013.01); *H02K 11/33* (2016.01); *H02M 7/537* (2013.01); *H03H 7/0115* (2013.01); *B60H 2001/3292* (2013.01); *H01F 2017/0093* (2013.01)

(58) Field of Classification Search
CPC ........ H02M 1/44; H02M 1/143; H02M 7/003; H02K 11/02; H02K 11/33
See application file for complete search history.

(56) References Cited

U.S. PATENT DOCUMENTS

| | | | |
|---|---|---|---|
| 5,940,272 A * | 8/1999 | Emori | ............... H05K 7/20927 165/185 |
| 8,777,585 B2 * | 7/2014 | Nakano | ............... F04B 49/065 417/44.11 |
| 8,796,889 B2 | 8/2014 | Arashi et al. | |

(Continued)

FOREIGN PATENT DOCUMENTS

| | | |
|---|---|---|
| JP | 2005-294358 A | 10/2005 |
| JP | 2008-98304 A | 4/2008 |

(Continued)

*Primary Examiner* — Yusef A Ahmed
(74) *Attorney, Agent, or Firm* — Sughrue Mion, PLLC

(57) ABSTRACT

An on-board fluid machine includes a housing configured to allow fluid to flow into the housing, an electric motor accommodated in the housing, and a driver that is supplied with DC power and drives the electric motor. The driver includes a low-pass filter circuit and an inverter circuit. The low-pass filter circuit includes a common mode choke coil and a capacitor. The driver further includes a damping unit located at a position where magnetic field lines produced by the common mode choke coil generate eddy current.

9 Claims, 8 Drawing Sheets

(56) References Cited

U.S. PATENT DOCUMENTS

| | | | |
|---|---|---|---|
| 9,985,515 B1* | 5/2018 | Nikitin | H02M 7/53875 |
| 2004/0207503 A1* | 10/2004 | Flanders | H01F 3/14 |
| | | | 336/223 |
| 2008/0080106 A1* | 4/2008 | Mirafzal | H02M 1/12 |
| | | | 361/42 |
| 2011/0206544 A1 | 8/2011 | Saito et al. | |
| 2013/0301327 A1* | 11/2013 | Wagoner | H02M 1/126 |
| | | | 363/132 |
| 2015/0061421 A1* | 3/2015 | Yano | H02K 9/00 |
| | | | 310/52 |
| 2015/0061558 A1* | 3/2015 | Yano | F04B 39/121 |
| | | | 318/400.26 |
| 2016/0245269 A1* | 8/2016 | Nagata | F04C 29/0085 |
| 2016/0245288 A1* | 8/2016 | Yano | F04C 28/06 |
| 2016/0254723 A1* | 9/2016 | Suzuki | H02K 5/225 |
| | | | 310/43 |
| 2017/0012506 A1* | 1/2017 | Naito | H02M 3/155 |
| 2017/0151878 A1* | 6/2017 | Okamura | H05K 7/20 |
| 2017/0256356 A1* | 9/2017 | Takatsuji | H01F 27/06 |
| 2017/0279393 A1* | 9/2017 | Kawashima | H02P 21/22 |
| 2017/0288512 A1* | 10/2017 | Kagawa | H02K 11/33 |
| 2018/0123546 A1* | 5/2018 | Kagawa | F04B 17/03 |
| 2018/0194200 A1* | 7/2018 | Ambo | B60H 1/3223 |
| 2018/0287543 A1* | 10/2018 | Kawashima | F04B 49/10 |
| 2019/0089243 A1* | 3/2019 | Naito | H02M 7/48 |
| 2019/0301490 A1* | 10/2019 | Ambo | F04D 29/4206 |
| 2019/0305647 A1* | 10/2019 | Ambo | B60H 1/3226 |
| 2019/0305648 A1* | 10/2019 | Ambo | H02P 1/00 |

FOREIGN PATENT DOCUMENTS

| | | |
|---|---|---|
| JP | 2010-112260 A | 5/2010 |
| JP | 2010-156271 A | 7/2010 |

* cited by examiner

ON-BOARD FLUID MACHINE

BACKGROUND ART

The present invention relates to an on-board fluid machine.

Japanese Laid-Open Patent Publication No. 2010-156271 discloses an on-board fluid machine including, for example, an electric motor and a driver that drives the electric motor. The driver converts DC power, which is supplied from a DC power supply mounted on the vehicle, to AC power.

Common mode noise and normal mode noise may both be mixed in the DC power supplied to the driver. In such a case, the noises may interfere with the driver that drives the electric motor. This will affect the operation of the on-board fluid machine.

In particular, normal mode noise has a frequency that differs in accordance with the model of the vehicle on which the on-board fluid machine is mounted. It is thus preferred that the normal mode noise be decreased over a wide frequency range so that the on-board fluid machine can be applied to many vehicle models. It is also preferred that this be realized without enlarging the on-board fluid machine.

SUMMARY OF THE INVENTION

It is an object of the present invention to provide an on-board fluid machine that reduces the common mode noise and normal mode noise included in the DC power supplied to the driver.

To achieve the above object, one aspect of the present invention is an on-board fluid machine including a housing, an electric motor, and a driver. The housing is configured to allow fluid to flow into the housing. The electric motor is accommodated in the housing. The driver is supplied with DC power and drives the electric motor. The driver includes a low-pass filter circuit and an inverter circuit. The low-pass filter circuit is configured to reduce common mode noise and normal mode noise that are included in the DC power. The inverter circuit is configured to convert the DC power, from which the common mode noise and the normal mode noise have been reduced, to AC power. The low-pass filter circuit includes a common mode choke coil and a capacitor. The common mode choke coil includes a ring core and a first coil and a second coil that are wound around the ring core. The capacitor is electrically connected to the common mode choke coil. The driver further includes a damping unit located at a position where magnetic field lines produced by the common mode choke coil generate eddy current. The damping unit includes a first part and a second part. The first part is box-shaped and includes a first opening, and the second part is box-shaped and includes a second opening. The first part and the second part cooperate to accommodate the common mode choke coil in a state in which the first opening and the second opening are opposed to each other.

BRIEF DESCRIPTION OF THE DRAWINGS

The invention, together with objects and advantages thereof, may best be understood by reference to the following description of the presently preferred embodiments together with the accompanying drawings in which.

EMBODIMENTS OF THE INVENTION

One embodiment of an on-board fluid machine will now be described. The on-board fluid machine of the present embodiment is an on-board motor-driven compressor including a compression unit that compresses fluid. The on-board motor-driven compressor is used with an on-board air-conditioner. Thus, the compression subject of the on-board motor-driven compressor in the present embodiment is a refrigerant.

Figure 1:
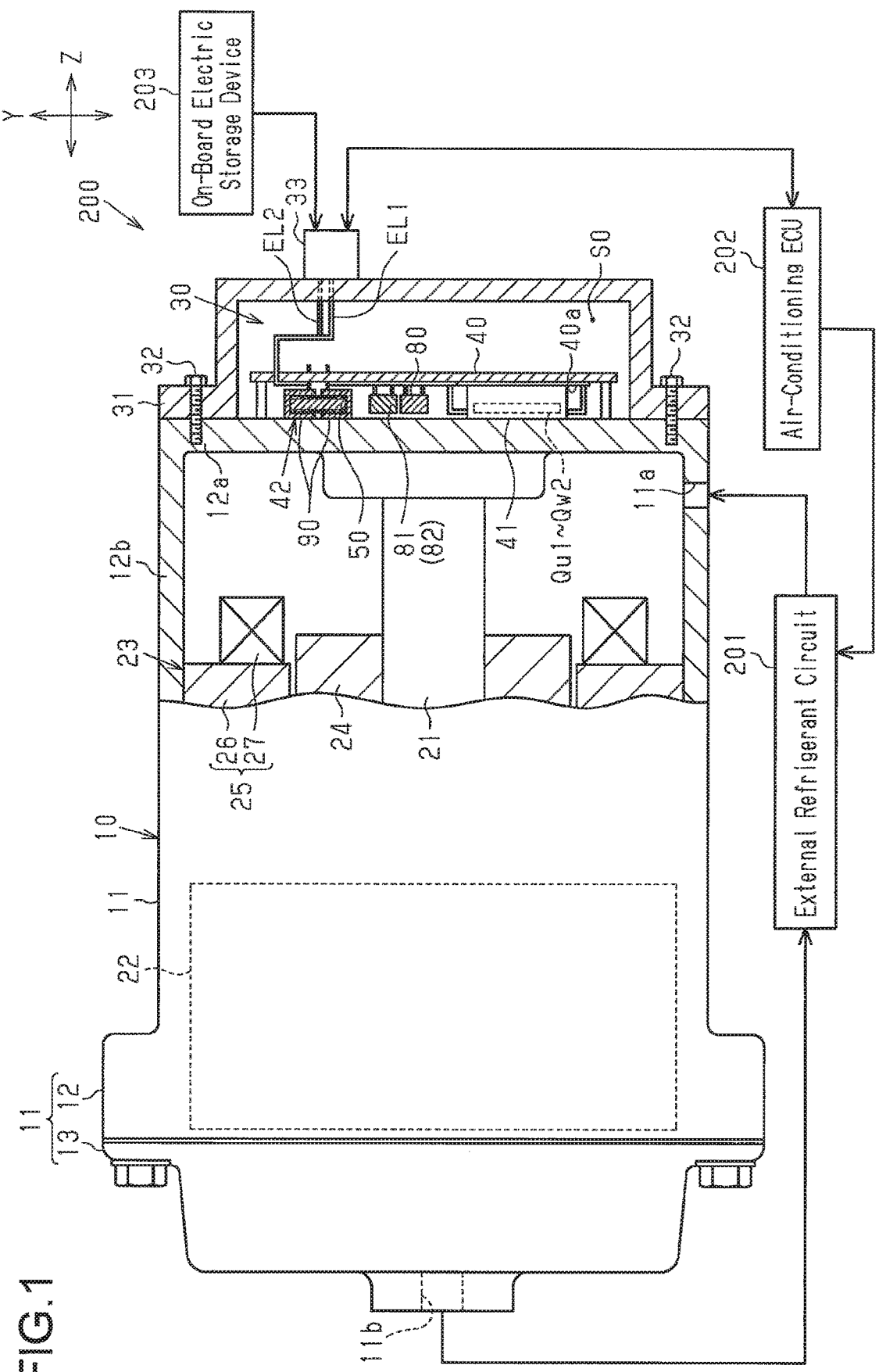
FIG. 1 is a schematic diagram of an on-board motor-driven compressor.

As shown in FIG. 1, an on-board air-conditioner 200 includes an on-board motor-driven compressor 10 and an external refrigerant circuit 201 that supplies the on-board motor-driven compressor 10 with a refrigerant serving as a fluid. The external refrigerant circuit 201 includes, for example, a heat exchanger, an expansion valve, and the like. The on-board air-conditioner 200 cools or warms the passenger compartment using the on-board motor-driven compressor 10 to compress the refrigerant and the external refrigerant circuit 201 to exchange heat with the refrigerant and expand the refrigerant.

The on-board air-conditioner 200 includes an air-conditioning ECU 202 that controls the entire on-board air-conditioner 200. The air-conditioning ECU 202 is configured to acknowledge the set temperature or the like of the on-board air-conditioner 200. Based on such parameters, the air-conditioning ECU 202 sends various commands, such as ON/OFF commands, to the on-board motor-driven compressor 10.

The on-board motor-driven compressor 10 includes a housing 11. The housing 11 includes a suction port 11a. Refrigerant is drawn from the external refrigerant circuit 201 through the suction port 11a.

The housing 11 is formed from a thermally conductive material (e.g., metal such as aluminum). The housing 11 is connected to ground by the body of the vehicle.

The housing 11 includes a suction housing portion 12 and a discharge housing portion 13 that are coupled to each other. The suction housing portion 12 is tubular and includes a flat end wall 12a and a side wall 12b, which extends from the circumferential portion of the end wall 12a toward the discharge housing portion 13. Further, the suction housing portion 12 has an opening faced toward the discharge housing portion 13. The end wall 12a is, for example, flat, and the side wall 12b is, for example, generally tubular. The discharge housing portion 13 is coupled to the suction housing portion 12 and closes the opening of the suction housing portion 12. This defines a cavity in the housing 11.

The suction port 11a is formed in the side wall 12b of the suction housing portion 12. In detail, the suction port 11a is located in the side wall 12b of the suction housing portion 12 closer to the end wall 12a than the discharge housing portion 13.

The housing 11 includes a discharge port 11b from which the refrigerant is discharged. More specifically, the discharge port 11b is formed in the discharge housing portion 13 at a location facing toward the end wall 12a of the discharge housing portion 13.

The on-board motor-driven compressor 10 includes a rotation shaft 21, a compression unit 22, and an electric motor 23 that are accommodated in the housing 11.

The rotation shaft 21 is rotationally supported by the housing 11. The axial direction of the rotation shaft 21 coincides with the thickness-wise direction of the end wall 12a (i.e., axial direction of tubular side wall 12b). The rotation shaft 21 is coupled to the compression unit 22.

The compression unit 22 is located in the housing 11 closer to the discharge port 11b than the suction port 11a (i.e., end wall 12a). The compression unit 22 rotates the rotation shaft 21 to compress the refrigerant drawn into the housing 11 from the suction port 11a and discharge the compressed refrigerant from the discharge port 11b. The compression unit 22 may be of any construction such as that of a scroll type, a piston type, or a vane type.

The electric motor 23 is located in the housing 11 between the compression unit 22 and the end wall 12a. The electric motor 23 rotates the rotation shaft 21 in the housing 11 to drive the compression unit 22. The electric motor 23 includes, for example, a cylindrical rotor 24 that is fixed to the rotation shaft 21 and a stator 25 that is fixed to the housing 11. The stator 25 includes a tubular stator core 26 and coils 27 that are wound around the teeth of the stator core 26. The rotor 24 is opposed to the stator 25 in the radial direction of the rotation shaft 21. The coils 27 are energized to rotate the rotor 24 and the rotation shaft 21 and compress refrigerant with the compression unit 22.

As shown in FIG. 1, the on-board motor-driven compressor 10 includes a driver 30 and a cover member 31. The driver 30 is supplied with DC power and drives the electric motor 23. The cover member 31 defines an accommodation compartment S0 that accommodates the driver 30.

The cover member 31 is formed from a thermally and electrically conductive, non-magnetic material (e.g., metal such as aluminum).

The cover member 31 is tubular and includes a closed end and an open end. The opening of the open end is faced toward the housing 11, more specifically, the end wall 12a of the suction housing portion 12. The open end of the cover member 31 is joined with the end wall 12a of the housing 11 and fastened to the end wall 12a by bolts 32. The end wall 12a closes the opening of the cover member 31. The accommodation compartment S0 is defined by the cover member 31 and the end wall 12a.

The accommodation compartment S0 is located outside the housing 11 at the side of the end wall 12a opposite to the electric motor 23. The compression unit 22, the electric motor 23, and the driver 30 are lined in the axial direction of the rotation shaft 21.

A connector 33 is arranged on the cover member 31, and the driver 30 is electrically connected to the connector 33. The connector 33 electrically connects the air-conditioning ECU 202 and the driver 30. Further, the driver 30 is supplied with DC power from an on-board electric storage device 203 installed in the vehicle. The on-board electric storage device 203 is a DC power supply, such as a rechargeable battery or a capacitor, installed in the vehicle.

As shown in FIG. 1, the driver 30 includes a circuit board 40, an inverter circuit 41 laid out on the circuit board 40, two connection lines EL1 and EL2 electrically connected to the connector 33 and the inverter circuit 41, and a low-pass filter circuit 42 arranged on the connection lines EL1 and EL2.

The circuit board 40 is flat and spaced apart from the end wall 12a by a predetermined distance in the axial direction of the rotation shaft 21. The circuit board 40 includes a board surface 40a faced toward the end wall 12a.

Figure 2:
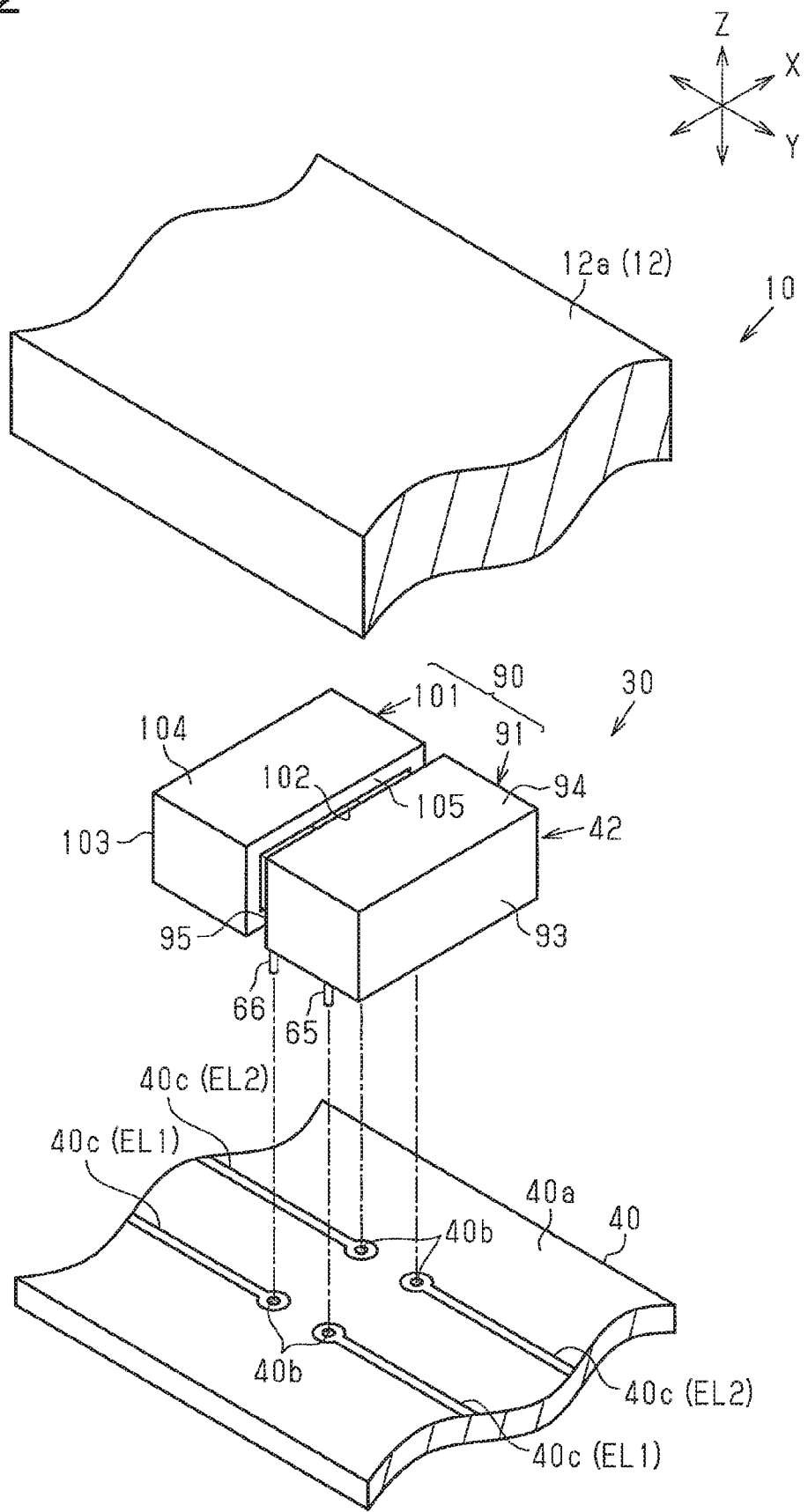
FIG. 2 is an exploded perspective view of a driver.

As shown in FIG. 2, the circuit board 40 includes terminal holes 40b and wires 40c that are connected to terminals inserted through the terminal holes 40b. The wires 40c each form at least a portion of the two connection lines EL1 and EL2. In detail, the wires 40c are used to electrically connect the connector 33 to the low-pass filter circuit 42 and to electrically connect the low-pass filter circuit 42 to the inverter circuit 41.

The wires 40c may be formed on the board surface 40a or on the opposite surface of the board surface 40a. Alternatively, the wires 40c may be formed in multiple layers. The wires 40c may be of any structure. For example, the wires 40c may be wire patterns formed on or embedded in the board. Alternatively, the wires 40c may be bars, like bus bars, or be flat.

The first connection line EL1 is electrically connected by the connector 33 to a positive terminal of the on-board electric storage device 203 and to the inverter circuit 41. The second connection line EL2 is electrically connected by the connector 33 to a negative terminal of the on-board electric storage device 203 and to the inverter circuit 41. The DC power supplied from the on-board electric storage device 203 to the connector 33 is transmitted over the two connection lines EL1 and EL2.

The low-pass filter circuit 42, which is arranged on the two connection lines EL1 and EL2, is located at the input side of the inverter circuit 41. The low-pass filter circuit 42 is configured to receive DC power from the connector 33. The low-pass filter circuit 42 reduces (attenuates) normal mode noise and common mode noise that are included in the DC power supplied to the driver 30.

Common mode noise is the noise that flows through the two connection lines EL1 and EL2 in the same direction. Common mode noise may be produced when, for example, the driver 30 (i.e., on-board motor-driven compressor 10) and the on-board electric storage device 203 are electrically connected through a path (e.g., body of vehicle) other than the two connection lines EL1 and EL2.

Normal mode noise is noise that has a predetermined frequency and is superposed on DC current. Further, normal mode noise is noise in which current momentarily flows through the two connection lines EL1 and EL2 in opposite directions. Thus, normal mode noise can be referred to as an inflow ripple component included in the DC power supplied to the driver 30. The low-pass filter circuit 42 will be described in detail later.

The inverter circuit 41 is connected by the wires 40c to the output side of the low-pass filter circuit 42. The inverter circuit 41 is supplied with the DC power output from the low-pass filter circuit 42, that is, the DC power of which the normal mode noise and common mode noise have been reduced by the low-pass filter circuit 42.

The inverter circuit 41 converts the DC power to AC power. In detail, the inverter circuit 41 is a three-phase inverter including switching elements Qu1, Qu2, Qv1, Qv2, Qw1, and Qw2 (hereafter simply referred to as the switching elements Qu1 to Qw2). The switching elements Qu1 to Qw2 are cyclically activated and deactivated to convert DC power to AC power.

The inverter circuit 41 is electrically connected by some of the wires 40c and hermetic terminals (not shown) formed in the end wall 12a to the coils 27 of the electric motor 23.

The AC power converted from DC power by the inverter circuit 41 is supplied to the coils 27 to drive the electric motor 23.

In the present embodiment, the inverter circuit 41 is located between the board surface 40a and the end wall 12a. Instead, the inverter circuit 41 may be located at the opposite side of the board surface 40a or beside the circuit board 40.

The configuration of the low-pass filter circuit 42 will now be described in detail with reference to FIGS. 1, 2 and 3 to 7. To facilitate illustration, the low-pass filter circuit 42 is shown without an insulator 111 in FIG. 3.

Figure 3:
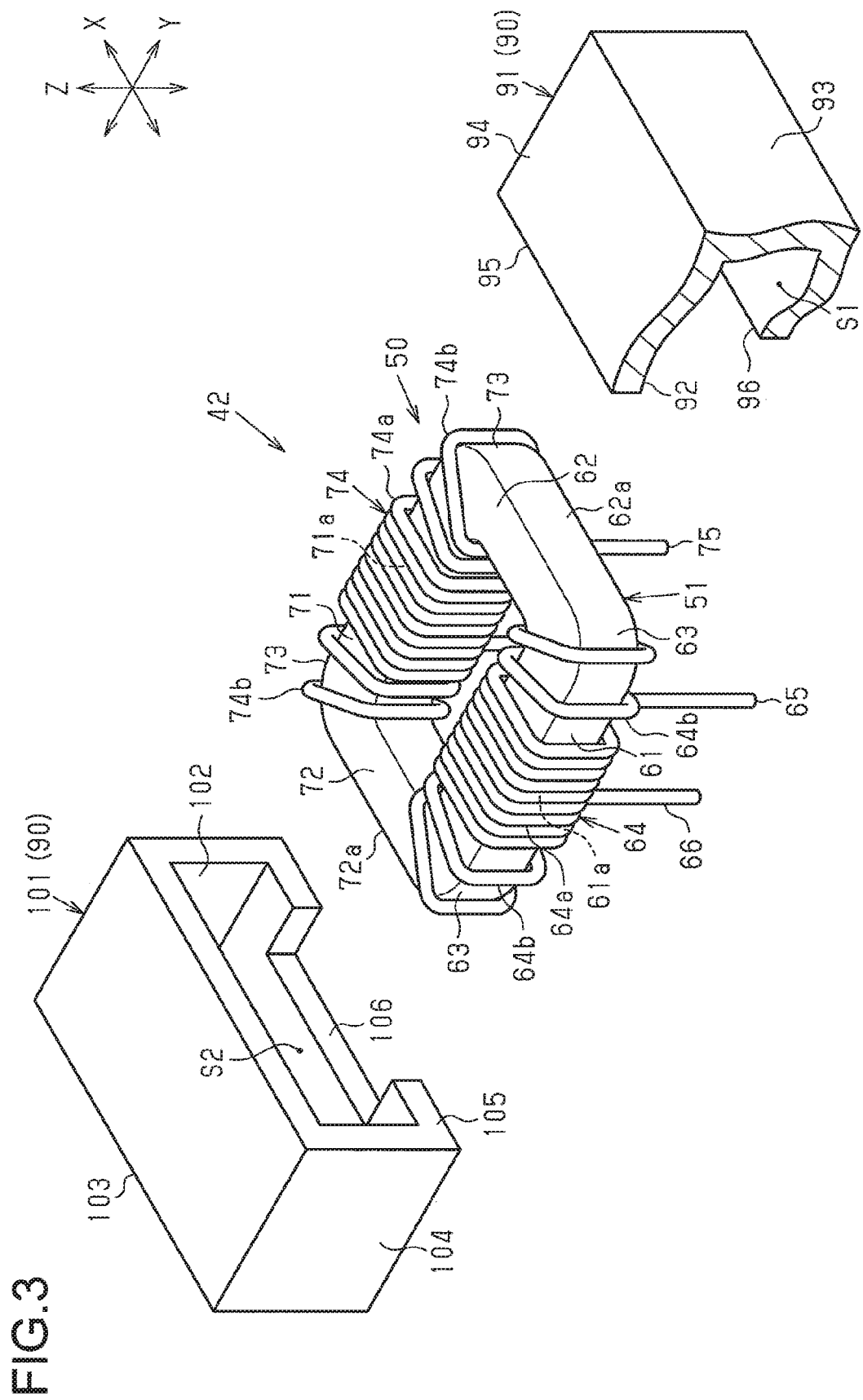
FIG. 3 is an exploded perspective view of a common mode choke coil and two parts.

Referring to FIG. 3, the low-pass filter circuit 42 includes a common mode choke coil 50. The common mode choke coil 50 includes a looped ring core 51. The ring core 51 of the present embodiment is rectangular and includes rounded corners so as to be looped (ring-shaped) in an axial view of the ring core 51. Further, the ring core 51 includes two long sides 61 and 71, extending straight in a longitudinal direction in the axial view of the ring core 51, and two short sides 62 and 72, extending straight in a lateral direction in the axial view of the ring core 51.

The two long sides 61 and 71 are opposed to each other, and the two short sides 62 and 72 are opposed to each other. The opposing direction of the two long sides 61 and 71 is orthogonal to the opposing direction of the two short sides 62 and 72.

To aid understanding, the opposing direction of the long sides 61 and 71 will be referred to as the X-axis direction, the opposing direction of the two short sides 62 and 72 will be referred to as the Y-axis direction, and the axial direction of the ring core 51 will be referred to as the Z-axis direction. The X-axis direction may also be referred to as the lateral direction of the ring core 51 or the extending direction of the two short sides 62 and 72. The Y-axis direction may be referred to as the longitudinal direction of the ring core 51 or the extending direction of the two long sides 61 and 71. The X-axis direction, the Y-axis direction, and the Z-axis direction are orthogonal to one another.

In the present embodiment, as shown in FIGS. 1 and 2, the Z-axis direction, which is the axial direction of the ring core 51, coincides with the axial direction of the rotation shaft 21. However, the Z-axis direction does not have to coincide with the axial direction of the rotation shaft 21, and the common mode choke coil 50 may be directed in any direction. For example, the X-axis direction or the Y-axis direction may coincide with the axial direction of the rotation shaft 21.

The ring core 51 includes two first corners 63, located at the two ends of the first long side 61 in the Y-axis direction, and two second corners 73 located at the two ends of the second long side 71 in the Y-axis direction. The two first corners 63 connect the first long side 61 to the two short sides 62 and 72. The two second corners 73 connect the second long side 71 to the two short sides 62 and 72. The corners 63 and 73 are each curved and shaped to be sectoral as viewed in the Z-axis direction.

Figure 4:
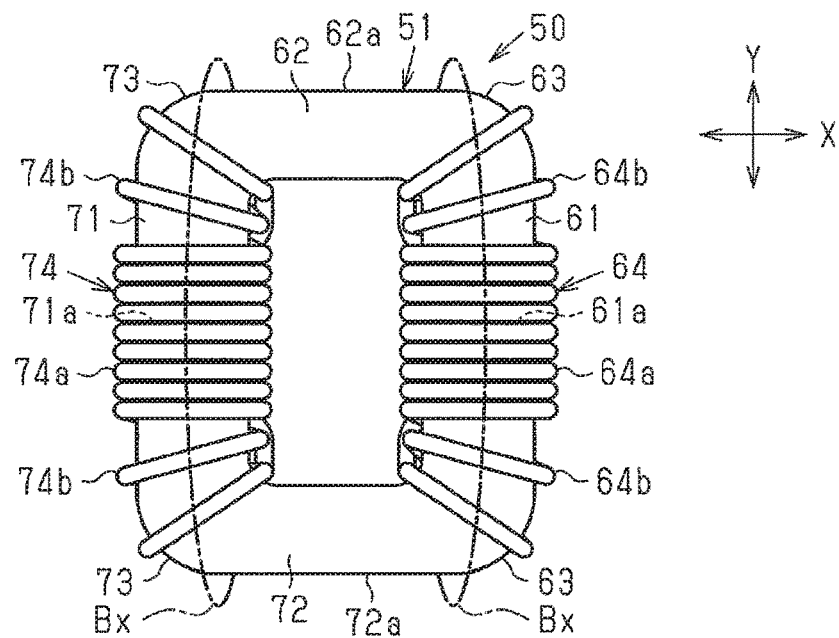
FIG. 4 is a front view of a ring core around which two coils are wound.

As shown in FIGS. 3 and 4, the common mode choke coil 50 includes a first coil 64 and a second coil 74 that are wound around the ring core 51.

The first coil 64 is wound around the entire first long side 61, which includes a central portion 61a of the first long side 61 in the Y-axis direction, and the first corners 63. The first long side 61 and the first corners 63 form a first winding portion around which the first coil 64 is wound.

The first coil 64 includes a first high-density portion 64a and first low-density portions 64b. The first high-density portion 64a has a winding density that differs from that of the first low-density portions 64b. The winding density is the number of windings per unit length in the winding axis direction. The winding density of the first high-density portion 64a is higher than the winding density of the first low-density portions 64b.

The first high-density portion 64a is arranged on and around the central portion 61a of the first long side 61. The first low-density portions 64b are arranged at the two opposite sides of the first high-density portion 64a. More specifically, the first low-density portions 64b are arranged on the two ends of the first long side 61 in the Y-axis direction and on the first corners 63.

Since the first corners 63 are curved, the winding density of the first coil 64 wound around the first corners 63 has a tendency to become lower than that of the first coil 64 wound around the first long side 61.

The second coil 74 is wound around the entire second long side 71, which includes a central portion 71a of the second long side 71 in the Y-axis direction, and the second corners 73. The second long side 71 and the second corners 73 form a second winding portion around which the second coil 74 is wound.

The second coil 74 includes a second high-density portion 74a and second low-density portions 74b. The second high-density portion 74a has a winding density that differs from that of the second low-density portions 74b. The winding density of the second high-density portion 74a is higher than the winding density of the second low-density portions 74b.

The second high-density portion 74a is arranged on and around the central portion 71a of the second long side 71. The second low-density portions 74b are arranged at the two opposite sides of the second high-density portion 74a. More specifically, the second low-density portions 74b are arranged on the two ends of the second long side 71 in the Y-axis direction and on the second corners 73.

Since the second corners 73 are curved, the winding density of the second coil 74 wound around the second corners 73 has a tendency to become lower than that of the second coil 74 wound around the second long side 71.

As shown in FIG. 4, the two coils 64 and 74 are not wound around the two short sides 62 and 72. The two short sides 62 and 72 may be referred to as non-winding portions around which the two coils 64 and 74 are not wound. Thus, the short sides 62 and 72 include side surfaces 62a and 72a around which the two coils 64 and 74 are not wound, respectively. The side surfaces 62a and 72a of the short sides 62 and 72 define the two outer end surfaces of the ring core 51 in the Y-axis direction. Hereinafter, the side surface 62a will be referred to as the first non-winding side surface 62a of the first short side 62, and the side surface 72a of the second short side 72 will be referred to as the second non-winding side surface 72a. The two non-winding side surfaces 62a and 72a intersect (more specifically, are orthogonal) the Y-axis direction, which is the extending direction of the two long sides 61 and 71. In the present embodiment, the two non-winding side surfaces 62a and 72a extend in the X-axis direction and the Z-axis direction. The two non-winding side surfaces 62a and 72a are opposed to each other in the Y-axis direction.

In the present embodiment, the first long side 61 corresponds to "the first extension," and the second long side 71 corresponds to "the second extension." The winding axis direction of the first high-density portion 64a is the Y-axis direction and coincides with that of the second high-density portion 74a.

The two coils 64 and 74 are opposed to each other in the X-axis direction, which is orthogonal to the Z-axis direction that is the axial direction of the ring core 51. The extending direction of the two long sides 61 and 71 intersects (preferably, is orthogonal to) the opposing direction of the two coils 64 and 74 and the axial direction of the ring core 51.

The two coils 64 and 74 are set to have the same number of windings. The two coils 64 and 74 are wound so that the magnetic flux generated by the coil 64 and the magnetic flux generated by the coil 74 strengthen each other when common mode currents, which are currents that flow in the same direction, flow through the two coils 64 and 74 and so that the magnetic flux generated by the coil 64 and the magnetic flux generated by the coil 74 cancel each other when normal mode currents, which are currents that flow in opposite directions, flow through the two coils 64 and 74.

As shown by the single-dashed lines in FIG. 4, some of the magnetic flux leaks even when normal mode currents flow through the two coils 64 and 74. This produces leakage flux Bx (i.e., magnetic field lines) in the common mode choke coil 50. Thus, the common mode choke coil 50 has a predetermined inductance with respect to normal mode current. In other words, the common mode choke coil 50 has a relatively large impedance (in detail, inductance) with respect to common mode currents and a relatively small impedance with respect to normal mode currents.

The two coils 64 and 74 are not wound around the two short sides 62 and 72. Thus, magnetic flux has a tendency to leak from the ring core 51. As a result, the leakage flux Bx has a tendency to be large compared with a structure in which a coil is wound entirely around the ring core 51. Further, the coils 64 and 74 include the low-density portions 64b and 74b. Thus, the leakage flux Bx has a tendency to be large compared with a structure in which the coils 64 and 74 are formed by only the high-density portions 64a and 74a.

As described above, the ring core 51 does not have the form of a circular ring that is free from straight portions. Rather, the ring core 51 is non-circular and includes the long sides 61 and 71, the short sides 62 and 72, and the curved corners 63 and 73. The winding density of the coils 64 and 74 wound around the corners 63 and 73 has a tendency to be lower than locations that are straightly formed. In this regard, the shape of the ring core 51 including the long sides 61 and 71, the short sides 62 and 72, and the curved corners 63 and 73 forms the high-density portions 64a and 74a and the low-density portions 64b and 74b.

As shown in FIG. 4, the leakage flux Bx is produced at each of the two coils 64 and 74 and has the form of a loop extending from one of the two non-winding side surfaces 62a and 72a to the other one of the two non-winding side surfaces 62a and 72a in the Y-axis direction. The leakage flux Bx has a tendency to concentrate more at the two non-winding side surfaces 62a and 72a, which intersect (in detail, extends orthogonal to) the winding axis direction of the high-density portions 64a and 74a, than the side surfaces of the long sides 61 and 71. In the present embodiment, the coils 64 and 74 are wound around the corners 63 and 73 in addition to the long sides 61 and 71. Thus, the leakage of magnetic flux from the side surfaces of the corners 63 and 73 is limited, and the leakage flux Bx has a tendency to concentrate at the two non-winding side surfaces 62a and 72a.

Figure 5:
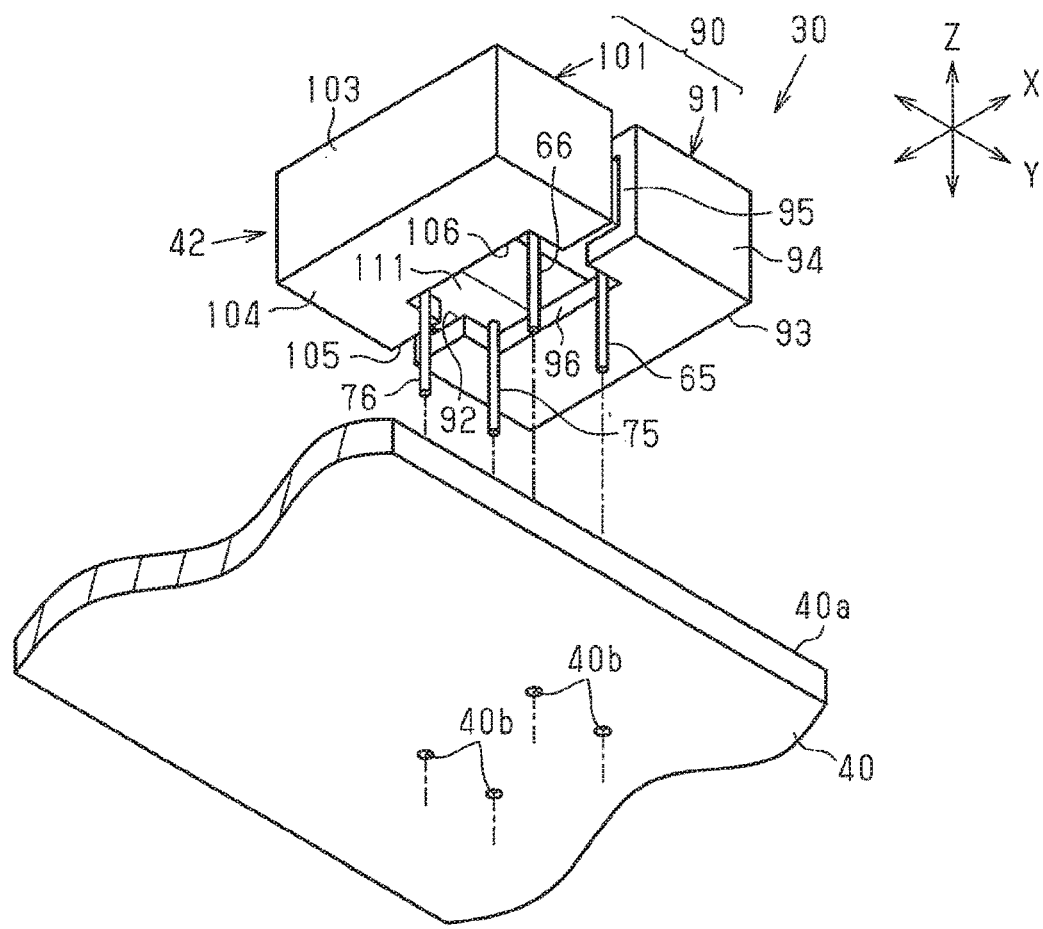
FIG. 5 is an exploded perspective view of the driver.

As shown in FIGS. 3 and 5, the common mode choke coil 50 includes a first input terminal 65, a first output terminal 66, a second input terminal 75, and a second output terminal 76. The first input terminal 65 and the first output terminal 66 extend from the first coil 64. The second input terminal 75 and the second output terminal 76 extend from the second coil 74. The terminals 65, 66, 75, and 76 are located at the inner side of the ring core 51 and extend in the Z-axis direction. In the present embodiment, the two input terminals 65 and 75 are located closer to the central part of the common mode choke coil 50 than the first non-winding side surface 62a, and the two output terminals 66 and 76 are located closer to the central part of the common mode choke coil 50 than the second non-winding side surface 72a. As shown in FIG. 5, the terminals 65, 66, 75, and 76 are inserted through the terminal holes 40b of the circuit board 40 and electrically connected to the wires 40c. This couples the common mode choke coil 50 to the circuit board 40.

The two input terminals 65 and 75 are electrically connected by the wires 40c to the connector 33, and the two input terminals 65 and 75 are supplied with DC current from the on-board electric storage device 203. The two output terminals 66 and 76 are electrically connected to the inverter circuit 41 by the wires 40c.

As shown in FIG. 1, the low-pass filter circuit 42 includes an X capacitor 80 that is electrically connected to the common mode choke coil 50. In the present embodiment, the driver 30 includes two Y capacitors 81 and 82 in addition to the X capacitor 80.

In the present embodiment, the common mode choke coil 50 and the capacitors 80 to 82 are located between the board surface 40a and the end wall 12a. Instead, at least one of the common mode choke coil 50 and the capacitors 80 to 82 may be located on the surface of the circuit board 40 opposite to the board surface 40a or beside the circuit board 40.

The capacitors 80 to 82 each include a terminal inserted through the corresponding terminal hole 40b and fixed to the circuit board 40. This couples the capacitors 80 to 82 to the circuit board 40 in a state electrically connected to the common mode choke coil 50 and the inverter circuit 41. The electrical connection to the capacitors 80 to 82 will be described later in detail.

The driver 30 includes a damping unit 90 located at a position where the magnetic field lines (leakage flux Bx), which are produced by the common mode choke coil 50, generate eddy current Ie. The location of the damping unit 90 is set so that the magnetic field lines (leakage flux Bx), which are produced by the common mode choke coil 50, generate eddy current Ie at the damping unit 90.

As shown in FIGS. 2 and 3, the damping unit 90 includes a first part 91 and a second part 101. The parts 91 and 101 are box-shaped and respectively include openings 92 and 102, each opening in one direction, and end walls 93 and 103 (bottom walls). The two parts 91 and 101 are arranged with their openings 92 and 102 opposed to each other. In detail, the two openings 92 and 102 are opposed to each other in the Y-axis direction, which is the direction orthogonal to the Z-axis direction and which intersects (preferably, extends orthogonal to) the X-axis direction. The two parts 91 and 101 cooperate to accommodate the common mode choke coil 50. In this case, the two parts 91 and 101 cover most of the common mode choke coil 50.

Figure 6:
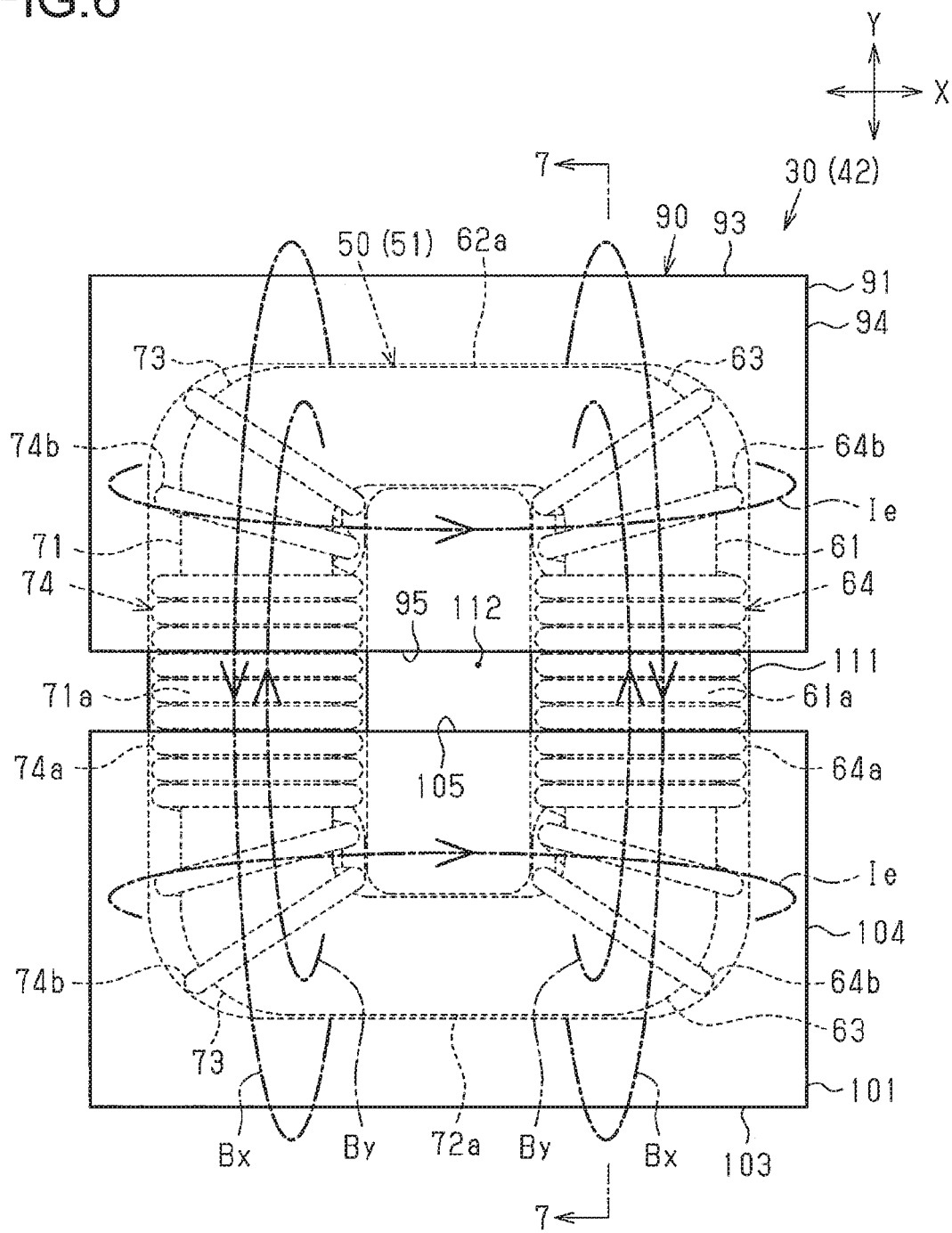
FIG. 6 is a front view of the common mode choke coil accommodated in a damping unit.

As shown in FIG. 6, the damping unit 90 (i.e., parts 91 and 101) is located at a position penetrated by the leakage flux Bx, which is produced at the common mode choke coil 50, that is, a position intersecting the leakage flux Bx. The leakage flux Bx penetrates the damping unit 90 so that the eddy current Ie flows through the damping unit 90 and generates magnetic flux By in a direction that cancels the leakage flux Bx. The damping unit 90 (i.e., parts 91 and 101) is formed from a non-magnetic conductive material, such as aluminum or brass, and has a relative permeability set to 0.9 to 3.

Figure 7:
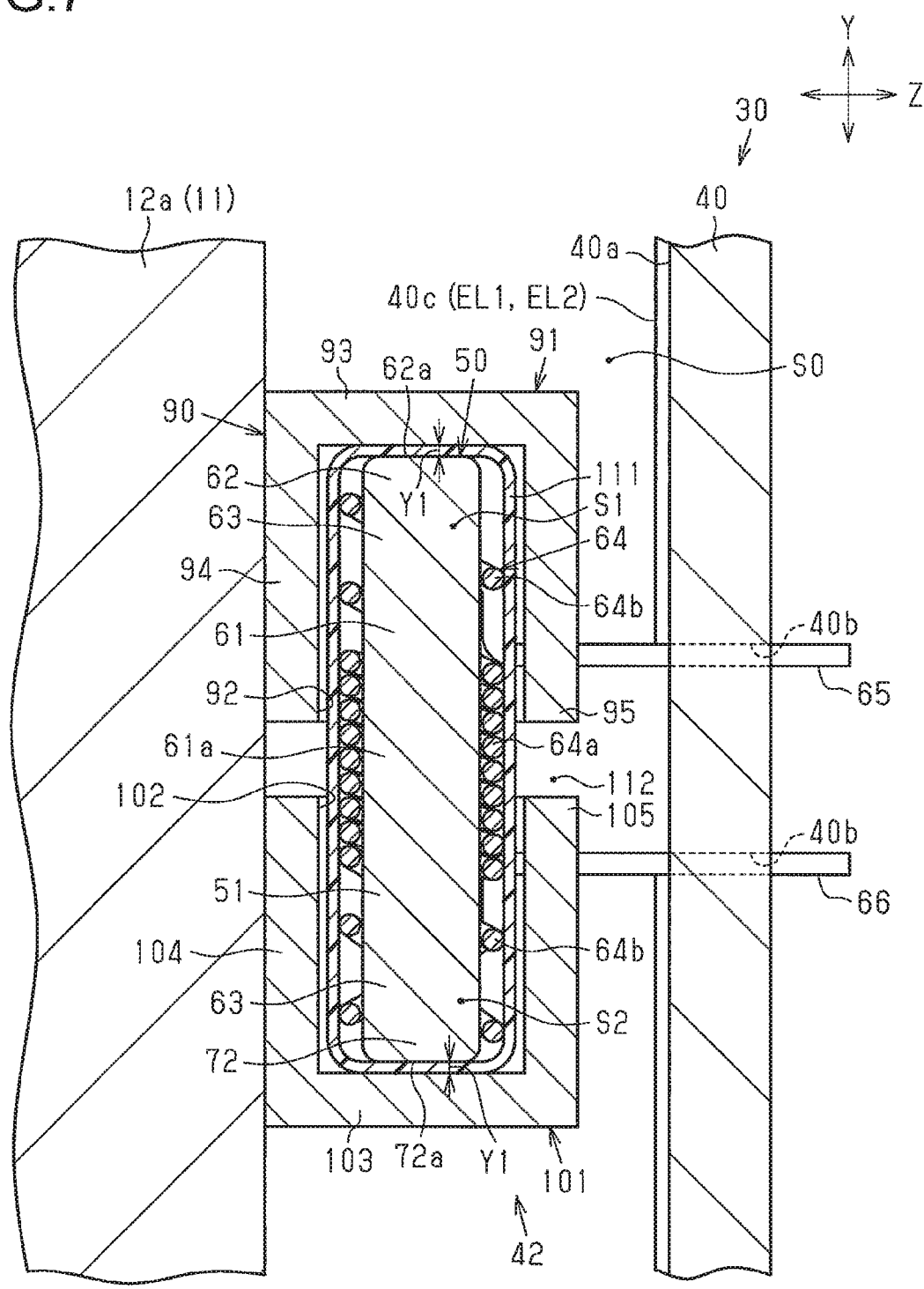
FIG. 7 is a cross-sectional view of the driver corresponding to line 7-7 in FIG. 6.

As shown in FIGS. 6 and 7, the first part 91 includes the first end wall 93 (bottom wall) that covers the first non-winding side surface 62a and a first peripheral wall 94 (side wall) that extends from the first end wall 93 toward the second part 101.

The first end wall 93 is flat and slightly larger than the first non-winding side surface 62a as viewed in the Y-axis direction. The first end wall 93 is opposed to the first non-winding side surface 62a in the Y-axis direction.

The first peripheral wall 94 is frame-shaped and surrounds the common mode choke coil 50 as viewed in the Y-axis direction. The first peripheral wall 94 surrounds both of the two long sides 61 and 71. The first peripheral wall 94 covers substantially one half of the common mode choke coil 50, that is, the side corresponding to the first non-winding side surface 62a. The first peripheral wall 94 covers the side of each of the two coils 64 and 74 that corresponds to the first non-winding side surface 62a. The first peripheral wall 94 includes a first distal end 95 that defines the first opening 92.

In the present embodiment, the first end wall 93 is rectangular. Further, the first peripheral wall 94 extends from the edges of the first end wall 93 and has the form of a rectangular frame as viewed in the Y-axis direction. However, the first end wall 93 and the first peripheral wall 94 may have any form. For example, the first end wall 93 may be oval and have the form of an ellipsoid.

As shown in FIG. 5, the first peripheral wall 94 includes a first recess 96 that extends from the first distal end 95 toward the first end wall 93. The first recess 96 is formed in the first peripheral wall 94 at a portion corresponding to the circuit board 40 and extends from the first distal end 95 to an intermediate position in the first peripheral wall 94 in the Y-axis direction.

The two input terminals 65 and 75 are extended through the first recess 96 and inserted through the terminal holes 40b. In detail, the two input terminals 65 and 75 are extended through the first recess 96 toward the circuit board 40 and inserted through the terminal holes 40b. This avoids interference of the two input terminals 65 and 75 with the first part 91.

As shown in FIGS. 6 and 7, the second part 101 includes the second end wall 103 (bottom wall) that covers the second non-winding side surface 72a and a second peripheral wall 104 (side wall) that extends from the second end wall 103 toward the first part 91.

The second end wall 103 and the first end wall 93 are identical in shape. The second end wall 103 is flat and slightly larger than the second non-winding side surface 72a as viewed in the Y-axis direction. The second end wall 103 is opposed to the second non-winding side surface 72a in the Y-axis direction. The first end wall 93 and the second end wall 103 are opposed to each other in the Y-axis direction.

The second peripheral wall 104 and the first peripheral wall 94 are identical in shape. The second peripheral wall 104 is frame-shaped and surrounds the common mode choke coil 50 as viewed in the Y-axis direction. The second peripheral wall 104 surrounds both of the two long sides 61 and 71. The second peripheral wall 104 covers substantially one half of the common mode choke coil 50, that is, the side corresponding to the second non-winding side surface 72a. The second peripheral wall 104 covers the side of each of the two coils 64 and 74 that corresponds to the second non-winding side surface 72a. The second peripheral wall 104 includes a second distal end 105 that defines the second opening 102.

As shown in FIG. 5, the second peripheral wall 104 includes a second recess 106 that extends from the second distal end 105 toward the second end wall 103. The second recess 106 is formed in the second peripheral wall 104 at a portion corresponding to the circuit board 40 and extends from the second distal end 105 to an intermediate position in the second peripheral wall 104 in the Y-axis direction.

The two output terminals 66 and 76 are extended through the second recess 106 and inserted through the terminal holes 40b. In detail, the two output terminals 66 and 76 extend through the second recess 106 toward the circuit board 40 and are inserted through the terminal holes 40b. This avoids interference of the two output terminals 66 and 76 with the second part 101. Thus, the terminals 65, 66, 75, and 76 of the two coils 64 and 74 are extended through one of the two recesses 96 and 106 and inserted through the terminal holes 40b to extend through the circuit board 40.

As shown in FIG. 7, the driver 30 includes the insulator 111 that insulates the common mode choke coil 50 and the damping unit 90. The insulator 111 is, for example, an insulation coating, which is applied to the surface of the common mode choke coil 50, or an insulation film. The insulator 111 functions to prevent short-circuiting between the common mode choke coil 50 and the damping unit 90.

The terminals 65, 66, 75, and 76 extend through the insulator 111. An insulation coating is applied to the basal ends of the terminals 65, 66, 75, and 76 to prevent short-circuiting of the terminals 65, 66, 75, and 76 with the two parts 91 and 101.

The insulator 111 is also arranged between the end walls 93 and 103 and the corresponding non-winding side surfaces 62a and 72a. The end walls 93 and 103 and the non-winding side surfaces 62a and 72a are in contact with the insulator 111. In this case, an opposing distance Y1 between the end walls 93 and 103 and the corresponding non-winding side surfaces 62a and 72a is the same as the thickness of the insulator 111.

In the present embodiment, the first peripheral wall 94 and the second peripheral wall 104 are slightly larger than the common mode choke coil 50 as viewed in the Y-axis direction so that the insulator 111 is spaced apart from the two peripheral walls 94 and 104.

However, the insulator 111 may be in contact with the two peripheral walls 94 and 104. This will allow the heat of the common mode choke coil 50 to be transmitted in a preferred manner to the two parts 91 and 101 and improve the heat dissipation of the common mode choke coil 50.

The insulator 111 may have any structure. For example, the insulator 111 may be an insulation coating applied to the inner surfaces of the two parts 91 and 101. In FIG. 7, the insulator 111 is illustrated thicker than actual.

The two parts 91 and 101 are coupled to the common mode choke coil 50 from the Y-axis direction and positioned relative to the common mode choke coil 50 in a state in which the end walls 93 and 103 and the non-winding side surfaces 62a and 72a are in contact with the insulator 111. Consequently, the opposing distance Y1 (thickness of insulator 111) is constant. In other words, the two parts 91 and 101 are positioned relative to the common mode choke coil 50 so that the opposing distance Y1 is constant regardless of dimensional errors of the two parts 91 and 101 and the common mode choke coil 50.

The two parts 91 and 101 may be positioned relative to the common mode choke coil 50 by any structure. For example, the structure may involve engagement, fitting, or adhering. Further, the driver 30 may include a clamp that clamps the two parts 91 and 101 in the Y-axis direction. In this case, the two parts 91 and 101 are also coupled to the common mode choke coil 50 in a state in which displacement of the two parts 91 and 101 is restricted in the Y-axis direction. The clamp may include, for example, two urging members that urge the two parts 91 and 101 toward each other.

As shown in FIG. 7, the two parts 91 and 101 are spaced apart from each other in a state in which the two distal ends 95 and 105 are opposed to each other in the Y-axis direction. Thus, a gap 112 extends between the first distal end 95 and the second distal end 105. The gap 112 extends over a distance that is greater than the opposing distance Y1 from the end walls 93 and 103 to the corresponding non-winding side surfaces 62a and 72a. The damping unit 90 does not cover portions of the two coils 64 and 74 corresponding to the gap 112 extending between the two distal ends 95 and 105.

The gap 112 and the central portions 61a and 71a of the two long sides 61 and 71 are located at corresponding positions in the Y-axis direction. Thus, the damping unit 90 does not cover the sections of the high-density portions 64a and 74a in the two coils 64 and 74 corresponding to the gap 112, that is, the sections of the two coils 64 and 74 wound around the central portions 61a and 71a of the two long sides 61 and 71. Further, the damping unit 90 does not cover the section of the two coils 64 and 74 corresponding to the two recesses 96 and 106.

The first end wall 93 and the first peripheral wall 94 define a first part accommodation compartment S1 in the first part 91. Further, the second end wall 103 and the second peripheral wall 104 define a second part accommodation compartment S2 in the second part 101. The first part accommodation compartment S1 and the second part accommodation compartment S2 are opposed to each other in the Y-axis direction. In this case, the common mode choke coil 50 is accommodated in the first part accommodation compartment S1 and the second part accommodation compartment S2. That is, the two parts 91 and 101 cooperate with each other in a state in which the openings 92 and 102 are opposed to each other in order to accommodate the common mode choke coil 50. In detail, the two parts 91 and 101 accommodate the common mode choke coil 50 from the Y-axis direction that extends orthogonal to the Z-axis direction and intersects (in present embodiment, extends orthogonal to) the X-axis direction, which is the opposing direction of the two coils 64 and 74.

The two parts 91 and 101 of the damping unit 90 are in contact with the housing 11 (i.e., end wall 12a) to allow for heat exchange between the damping unit 90 and the housing 11. This cools the two parts 91 and 101 with the housing 11.

The electrical configuration of the electric motor 23 and the driver 30 will now be described.

Figure 8:
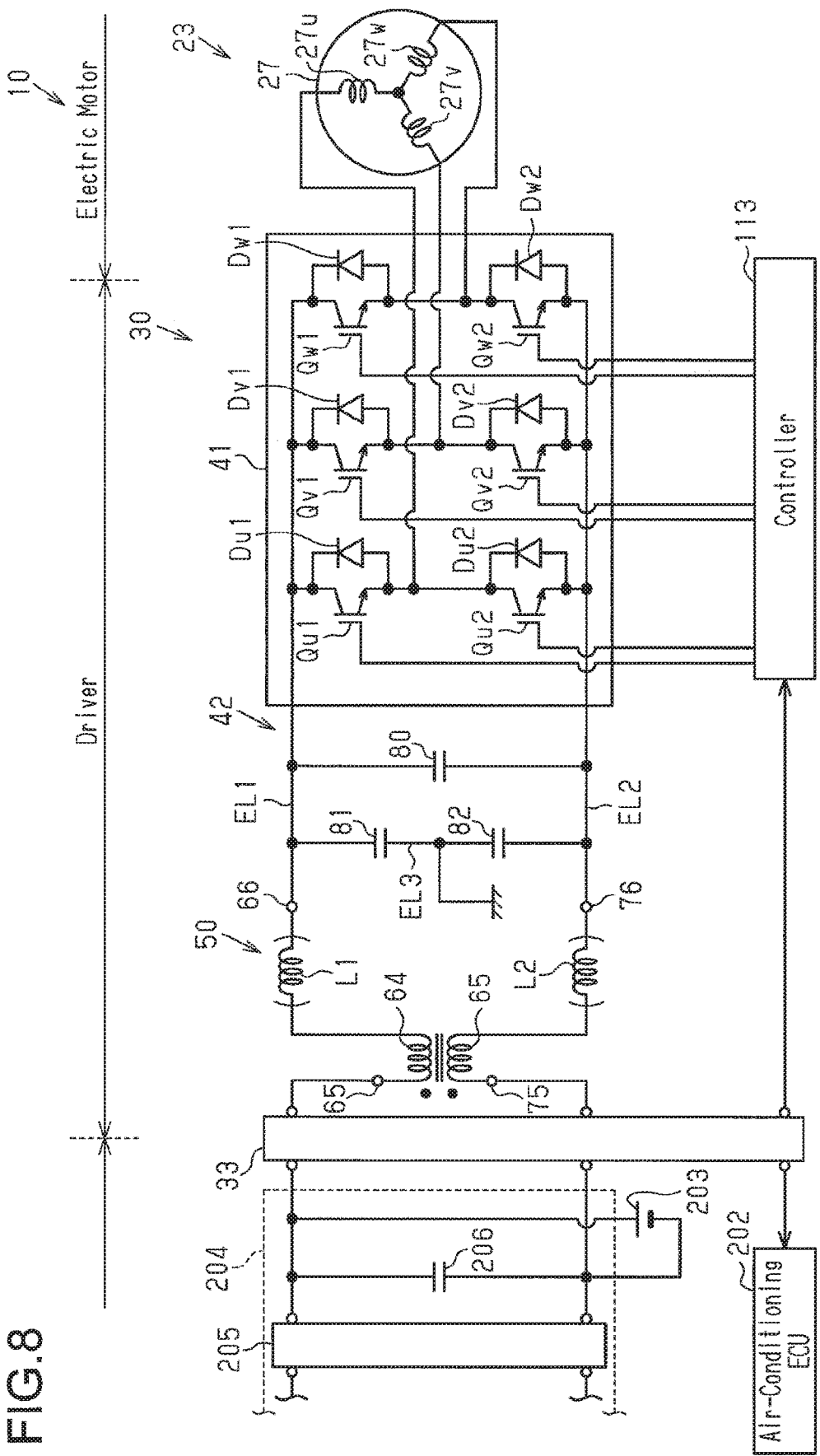
FIG. 8 is a circuit diagram of the driver and an electric motor.

As shown in FIG. 8, the coils 27 of the electric motor 23 form, for example, a three-phase construction including a u-phase coil 27u, a v-phase coil 27v, and a w-phase coil 27w. The u-phase coil 27u, the v-phase coil 27v, and the w-phase coil 27w are connected to one another in, for example, a Y connection.

The inverter circuit 41 includes u-phase switching elements Qu1 and Qu2 that correspond to the u-phase coil 27u, v-phase switching elements Qv1 and Qv2 that correspond to the v-phase coil 27v, and w-phase switching elements Qw1 and Qw2 that correspond to the w-phase coil 27w. The switching elements Qu1 to Qw2 are, for example, power switching elements such as insulated gate bipolar transistors (IGBTs). The switching elements Qu1 to Qw2 include flywheel diodes Du1 to Dw2 (body diodes).

The u-phase switching elements Qu1 and Qu2 are connected to each other in series by a connection wire, which is connected to the u-phase coil 27u. The series-connected body of the u-phase switching elements Qu1 and Qu2 is electrically connected to the two connection lines EL1 and EL2, and the series-connected body is supplied with DC power from the on-board electric storage device 203.

The other switching elements Qv1, Qv2, Qw1, and Qw2 are connected in the same manner as the u-phase switching elements Qu1 and Qu2 except in that the corresponding coil is different. In this case, the switching elements Qu1 to Qw2 are connected to the two connection lines EL1 and EL2.

The driver 30 includes a controller 113 that controls the switching elements Qu1 to Qw2. The controller 113 may be, for example, one or more dedicated hardware circuits and/or a circuitry realized by one or more processors running on a computer program (software). Each processor includes a CPU and a memory such as a RAM and a ROM. The memory stores, for example, program codes or commands configured to have the processor execute various types of processing. The memory, or computer-readable medium, is any medium that is accessible and usable by a versatile or dedicated computer.

The controller 113 is electrically connected by the connector 33 to the air-conditioning ECU 202 and cyclically activates and deactivates the switching elements Qu1 to Qw2 based on commands from the air-conditioning ECU 202. In detail, the controller 113 executes pulse-width modulation (PWM) control on the switching elements Qu1 to Qw2 based on commands from the air-conditioning ECU 202. More specifically, the controller 113 uses a carrier signal (carrier wave signal) and a command voltage signal (comparison subject signal) to generate a control signal. Then, the controller 113 uses the generated control signal to control activation and deactivation of the switching elements Qu1 to Qw2 and convert DC power to AC power.

As shown in the circuit diagram of FIG. 8, the low-pass filter circuit 42 is located between the connector 33 and the inverter circuit 41.

The common mode choke coil 50 is arranged on the two connection lines EL1 and EL2. As described above, the common mode choke coil 50 produces the leakage flux Bx when normal mode current flows. In this regard, the common mode choke coil 50 includes the hypothetical normal mode coils L1 and L2 in addition to the two coils 64 and 74. More specifically, in an equivalent circuit, the common mode choke coil 50 of the present embodiment includes the two coils 64 and 74 and the hypothetical normal mode coils L1 and L2. The hypothetical normal mode coils L1 and L2 are respectively connected in series to the coils 64 and 74.

The X capacitor 80 is arranged in a stage subsequent to the common mode choke coil 50, or at the side corresponding to the inverter circuit 41, and electrically connected to the two connection lines EL1 and EL2. The common mode choke coil 50 and the X capacitor 80 form an LC resonant circuit. That is, the low-pass filter circuit 42 of the present embodiment is an LC resonant circuit that includes the common mode choke coil 50.

The low-pass filter circuit 42 has a cutoff frequency fc set to be lower than a carrier frequency fp that is the frequency of the carrier signal. The carrier frequency fp may also be referred to as the switching frequency of each of the switching elements Qu1 to Qw2.

The vehicle includes, for example, a PCU (power control unit) 204, which serves as an on-board device, in addition to the driver 30. The PCU 204 uses the DC power supplied from the on-board electric storage device 203 to drive a travel motor or the like installed in the vehicle. In the present embodiment, the PCU 204 and the driver 30 are connected in parallel to the on-board electric storage device 203, and the on-board electric storage device 203 is shared by the PCU 204 and the driver 30.

The PCU 204 includes, for example, a boost converter 205 and a power capacitor 206. The boost converter 205 includes a boost switching element and cyclically activates and deactivates a boost switching element to step-up the DC power of the on-board electric storage device 203. The power capacitor 206 is connected in parallel to the on-board electric storage device 203. Although not illustrated in the drawings, the PCU 204 includes a travel inverter that converts the DC power stepped-up by the boost converter 205 to drive force that can drive the travel motor.

Noise generated by the switching of the boost switching element may enter the driver 30 as normal mode noise. In this case, the normal mode noise includes noise components corresponding to the switching frequency of the boost switching element. The switching frequency of the boost switching element differs between vehicle models. Thus, the frequency of the normal mode noise differs between vehicle models. Noise components corresponding to the switching frequency of the boost switching element may include harmonic components in addition to noise components having the same frequency as the switching frequency.

The two Y capacitors 81 and 82 are connected to each other in series. In detail, the driver 30 includes a bypass line EL3 that connects one end of the first Y capacitor 81 and one end of the second Y capacitor 82. The bypass line EL3 is connected to ground by the vehicle body.

A series-connected body of the two Y capacitors 81 and 82 is located between the common mode choke coil 50 and the X capacitor 80 and electrically connected to the common mode choke coil 50. The other end of the first Y capacitor 81 is connected to the first connection line EL1, that is, the section of the first connection line EL1 connecting the first coil 64 (first output terminal 66) and the inverter circuit 41. The other end of the second Y capacitor 82 is connected to the section of the second connection line EL2 connecting the second coil 74 (second output terminal 76) and the inverter circuit 41.

Figure 9:
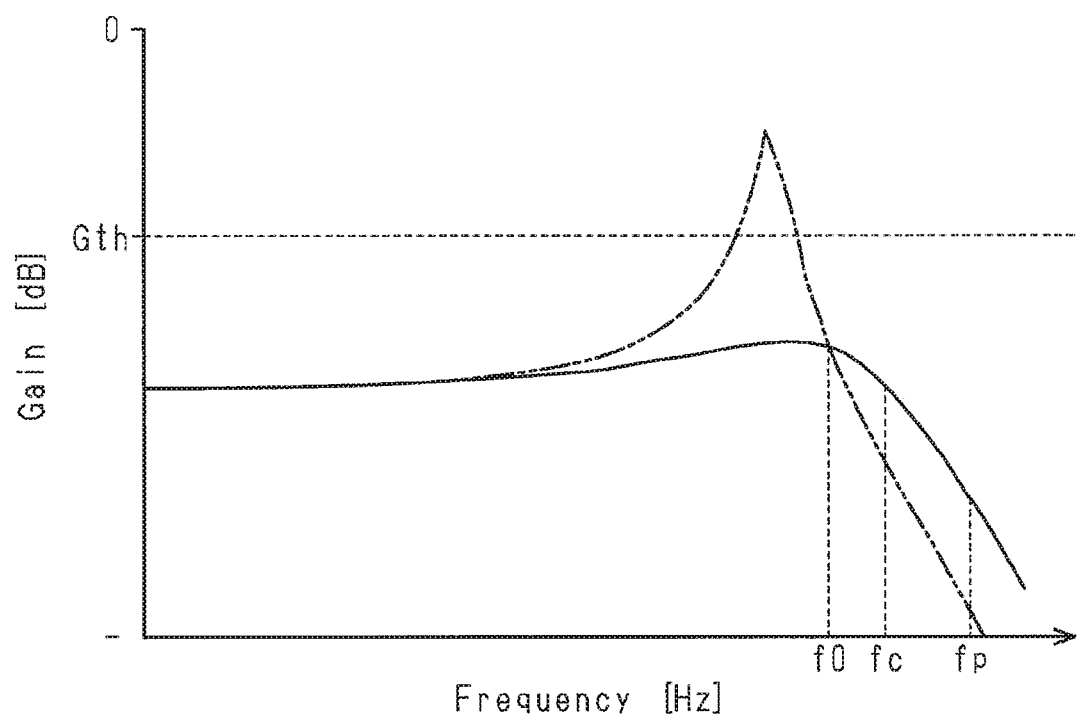
FIG. 9 is a graph illustrating the frequency characteristics of the gain of a low-pass filter circuit.

The frequency characteristics of the low-pass filter circuit 42 will now be described with reference to FIG. 9. FIG. 9 is a graph illustrating the frequency characteristics of the gain G (attenuation amount) of the low-pass filter circuit 42 relative to the entering normal mode noise. The solid line in FIG. 9 illustrates the frequency characteristics when the damping unit 90 exists, and the double-dashed line illustrates the frequency characteristics when the damping unit 90 does not exist. In FIG. 9, the horizontal axis represents the frequency as a logarithm. The gain G is a parameter indicating the amount that the normal mode noise can be reduced.

As shown by the double-dashed line in FIG. 9, when the damping unit 90 does not exist, the Q factor of the low-pass filter circuit 42 (i.e., LC resonant circuit including common mode choke coil 50 and X capacitor 80) is relatively high. Thus, it is difficult to reduce the normal mode noise at frequencies that are close to the resonant frequency f0 of the low-pass filter circuit 42. In other words, the normal mode noise has a tendency to increase at frequencies close to the resonant frequency f0 of the low-pass filter circuit 42.

In this respect, the present embodiment includes the damping unit 90 that is located at a position where the eddy current Ie is generated by the magnetic field lines (the leakage flux Bx) produced at the common mode choke coil 50. The damping unit 90 is located at a position penetrated by the leakage flux Bx. The penetration of the leakage flux Bx generates the eddy current Ie that produces the magnetic flux By in a direction canceling the leakage flux Bx. Thus, the damping unit 90 functions to lower the Q factor of the low-pass filter circuit 42. Accordingly, as shown by the solid line in FIG. 9, the Q factor of the low-pass filter circuit 42 is low. Thus, the low-pass filter circuit 42 also decreases normal mode noise at frequencies close to the resonant frequency f0 of the low-pass filter circuit 42.

The existence of the damping unit 90 lowers the inductance of the hypothetical normal mode coils L1 and L2. Thus, the resonant frequency f0 of the low-pass filter circuit 42 in the present embodiment is slightly higher than that when there is no damping unit 90.

As shown in FIG. 9, the tolerable value of the gain G required in accordance with the specification of the vehicle is referred to as the gain Gth. The Q factor of the gain G of the low-pass filter circuit 42 that becomes equal to the tolerable gain Gth when the frequency of the normal mode noise is the same as the resonant frequency f0 is referred to as a specific Q factor. In the present embodiment, the Q factor of the low-pass filter circuit 42 is lower than the specific Q factor because of the damping unit 90. Thus, the gain G of the low-pass filter circuit 42 when the frequency of the normal mode noise is the same as the resonant frequency f0 is smaller than the tolerable gain Gth (larger in absolute value). In other words, the damping unit 90 is configured to lower the Q factor of the low-pass filter circuit 42 from the specific Q factor.

One speculation of why the Q factor of the low-pass filter circuit 42 becomes low because of the damping unit 90 will now be described. The description hereafter is a speculation and does not negate the validity of the damping unit 90.

The magnetic flux By in the direction that cancels the leakage flux Bx functions as magnetic resistance to the leakage flux Bx of the common mode choke coil 50. Thus, the magnetic flux By, which cancels the leakage flux Bx, impedes the flow of normal mode current through the common mode choke coil 50, which causes the leakage flux Bx. In this manner, the magnetic flux By in the direction that cancels the leakage flux Bx functions as a resistance component to the normal mode current.

The leakage flux Bx in the direction that cancels the magnetic flux By has a tendency to increase more easily as the eddy current Ie generated at the damping unit 90 increases. The eddy current Ie generated at the damping unit 90 has a tendency to increase more easily as the normal mode noise increases. The normal mode noise (normal mode current) has a tendency to increase at frequencies close to the resonant frequency f0 of the low-pass filter circuit 42. Thus, the magnetic flux By in the direction that cancels the leakage flux Bx has a tendency to increase at frequencies close to the resonant frequency f0 of the low-pass filter circuit 42. Accordingly, the resistance components of the damping unit 90 have a tendency to increase at frequencies close to the resonant frequency f0 of the low-pass filter circuit 42. This decreases the Q factor of the low-pass filter circuit 42.

The present embodiment has the advantages described below.

(1) The on-board motor-driven compressor 10, which serves as the on-board fluid machine, includes the housing 11 that allows refrigerant serving as fluid to flow therein, the electric motor 23 that is accommodated in the housing 11, and the driver 30 that drives the electric motor 23 and is supplied with DC power. The driver 30 includes the low-pass filter circuit 42 and the inverter circuit 41. The low-pass filter circuit 42 reduces (attenuates) the common mode noise and the normal mode noise included in the DC power. The inverter circuit 41 converts the DC power from which the two noises have been reduced by the low-pass filter circuit 42 to AC power. The low-pass filter circuit 42 includes the looped ring core 51, the common mode choke coil 50 that includes the two coils 64 and 74 wound around the ring core 51, and the X capacitor 80 electrically connected to the common mode choke coil 50.

The driver 30 further includes the damping unit 90 set at a position where the leakage flux Bx (magnetic field lines) produced at the common mode choke coil 50 generates the eddy current Ie at the damping unit 90. The damping unit 90 includes the parts 91 and 101 that are box-shaped and have the openings 92 and 102. The two parts 91 and 101 cooperate to accommodate the common mode choke coil 50 in a state in which the openings 92 and 102 are opposed to each other.

The common mode choke coil 50 reduces the common mode noise included in the DC power supplied to the driver 30. Further, normal mode current flows through the common mode choke coil 50 and produces the leakage flux Bx. This reduces the normal mode noise with the common mode choke coil 50 and the low-pass filter circuit 42 including the X capacitor 80 that are electrically connected to each other. Accordingly, there is no need to use a dedicated coil that reduces normal mode noise. Further, the inverter circuit 41 can be supplied with DC power from which common mode noise and normal mode noise have both been reduced. Thus, enlargement of the driver 30 can be avoided. This limits enlargement of the on-board motor-driven compressor 10.

The two parts 91 and 101 cover the common mode choke coil 50. This lowers the Q factor of the low-pass filter circuit 42. More specifically, the magnetic field lines (leakage flux) at the common mode choke coil 50 generate eddy current at the two parts 91 and 101 and lower the Q factor of the low-pass filter circuit 42. Accordingly, the Q factor of the low-pass filter circuit 42 can be lowered without using a damping resistor. This improves versatility while limiting enlargement of the on-board motor-driven compressor 10.

As described above, when the low-pass filter circuit 42 has a high Q factor, it will be difficult to reduce the normal mode noise at frequencies close to the resonant frequency f0 of the low-pass filter circuit 42. Thus, the low-pass filter circuit 42 that has a high Q factor will not effectively function on normal mode noise having frequencies close to the resonant frequency f0. This may result in erroneous operation of the driver 30 or shorten the life of the low-pass filter circuit 42. Thus, when the Q factor of the low-pass filter circuit 42 is high, the low-pass filter circuit 42 cannot be applied to a vehicle model that generates normal mode noise having frequencies close to the resonant frequency f0. In the present embodiment, the damping unit 90 lowers the Q factor. This decreases the normal mode noise at frequencies close to the resonant frequency f0. More specifically, the resonant frequency f0 of the low-pass filter circuit 42 can be included in the frequency range in which the low-pass filter circuit 42 is able to reduce the normal mode noise, that is, the frequency range to which the driver 30 is applicable. This widens the frequency range of the normal mode noise that can be reduced by the low-pass filter circuit 42 so that the on-board motor-driven compressor 10 can be applied to a wide variety of vehicle models.

To decrease the Q factor, for example, a damping resistor may be connected in series to the common mode choke coil 50. However, a damping resistor needs to correspond to relatively large currents and is thus relatively large. This increases the power loss and generated heat. Thus, heat dissipation and the like need to be taken into consideration when connecting the damping resistor to the common mode choke coil 50. This may result in enlargement of the on-board motor-driven compressor 10.

In the present embodiment, the eddy current Ie is generated at the damping unit 90. However, the eddy current Ie is smaller than the current that flows through a damping resistor. Thus, the damping unit 90 generates a smaller amount of heat. This limits enlargement of the on-board motor-driven compressor 10 and reduces the two types of noise while improving the versatility.

In the present embodiment, the two parts 91 and 101 cooperate to accommodate the common mode choke coil 50. Thus, in comparison with a structure that accommodates the common mode choke coil 50 with a single part, the common mode choke coil 50 can be accommodated in a relatively easy manner.

When accommodating the common mode choke coil 50 with a single part, the part may include an opening so that the common mode choke coil 50 can be inserted from the opening. In this case, the damping unit will not entirely cover a single surface of the common mode choke coil 50. This will adversely affect the Q factor lowering effect (hereafter referred to as the damping effect) of the low-pass filter circuit 42.

For example, when the damping unit has a size that allows for the accommodation of the entire common mode choke coil 50 and is formed by a single part including an opening directed in the Y-axis direction and enabling the insertion of the common mode choke coil 50, one of the two non-winding side surfaces 62a and 72a will not be covered by the damping unit. Thus, it will be difficult for the leakage flux Bx to penetrate the damping unit. Further, for example, when the damping unit has a size that allows for the accommodation of the entire common mode choke coil 50 and is formed by a single part including an opening directed in the X-axis direction or the Z-axis direction and enabling the insertion of the common mode choke coil 50, the damping unit will not be looped and closed as viewed in the Y-axis direction and will be U-shaped and open at one side. This will hinder the flow of the eddy current Ie, which forms a closed loop as viewed in the Y-axis direction, through the damping unit. In contrast, the damping unit 90 of the present embodiment is formed by the two parts 91 and 101. Thus, the above problem does not occur.

The Q factor of the low-pass filter circuit 42 is lowered to reduce the normal mode noise at frequencies close to the resonant frequency f0. Thus, the damping effect may be referred to as an effect for reducing normal mode noise at frequencies close to the resonant frequency f0.

(2) The damping unit 90 is located at a position that the leakage flux Bx produced by the common mode choke coil 50 penetrates. The damping unit 90 is configured so that the penetration of the leakage flux Bx results in the flow of the eddy current Ie generated by the magnetic flux By in the direction canceling the leakage flux Bx. This obtains advantage (1).

(3) The two coils 64 and 74 are opposed to each other in the X-axis direction that is orthogonal to the Z-axis direction, which is the axial direction of the ring core 51. The two parts 91 and 101 accommodate the common mode choke coil 50 from a direction intersecting both of the Z-axis direction and the X-axis direction. In detail, the two parts 91 and 101 are opposed to each other in the Y-axis direction so that the openings 92 and 102 are opposed to each other in the Y-axis direction. In the common mode choke coil 50 in which the two coils 64 and 74 are opposed to each other in the X-axis direction, magnetic flux has a tendency to leak in the Y-axis direction that is orthogonal to both of the axial direction and the opposing direction of the two coils 64 and 74. In this respect, the two parts 91 and 101 accommodate the common mode choke coil 50 from a direction that is orthogonal to the axial direction and intersects the opposing direction of the two coils 64 and 74. Thus, the leakage flux Bx easily penetrates the two parts 91 and 101. This reduces the amount of the leakage flux Bx that does not penetrate the two parts 91 and 101. Accordingly, the damping effect can be improved.

(4) The ring core 51 includes the first long side 61 and the second long side 71 that extend in the Y-axis direction. The first coil 64 is partially wound around the first long side 61, and the second coil 74 is partially wound around the second long side 71. The ring core 51 includes the two non-winding side surfaces 62a and 72a that are the two outer end surfaces in the Y-axis direction, which is the extending direction of the two long sides 61 and 71, around which the two coils 64 and 74 are not wound.

The parts 91 and 101 include the end walls 93 and 103, which cover the non-winding side surfaces 62a and 72a, and the peripheral walls 94 and 104, which extend from the end walls 93 and 103 as viewed in the Y-axis direction and are frame-shaped to surround the common mode choke coil 50. The peripheral walls 94 and 104 include the distal ends 95 and 105 that define the openings 92 and 102 of the parts 91 and 101, respectively.

The end walls 93 and 103 cover the non-winding side surfaces 62a and 72a where the leakage flux Bx has a tendency to concentrate. Thus, the leakage flux Bx easily penetrates the two end walls 93 and 103. Further, the leakage flux Bx that penetrates the two end walls 93 and 103 generates the eddy current Ie at the peripheral walls 94 and 104. The eddy current Ie flows in the circumferential direction of the frame-shaped peripheral walls 94 and 104. That is, the eddy current Ie forms a closed loop as viewed in the Y-axis direction. This easily forms the magnetic flux By in a direction that cancels the leakage flux Bx flowing in the Y-axis direction (i.e., extending direction of first and second long sides 61 and 71). Thus, the damping effect can be further improved.

When accommodating the common mode choke coil 50 with the two box-shaped parts, for example, when coupling two parts to the common mode choke coil 50 from the X-axis direction, the peripheral wall will be frame-shaped as viewed in the X-axis direction and not frame-shaped as viewed in the Y-axis direction. Such a structure limits the generation of the eddy current Ie forming a closed loop at the peripheral wall as viewed in the Y-axis direction. This decreases magnetic flux in the direction canceling the leakage flux Bx.

In the present embodiment, as described above, the existence of the peripheral walls 94 and 104 that are frame-shaped as viewed in the Y-axis direction will easily generate the eddy current Ie that forms a closed loop at the peripheral walls 94 and 104. This sufficiently generates the magnetic flux By in a direction that cancels the leakage flux Bx and further improves the damping effect.

(5) The peripheral walls 94 and 104 are frame-shaped and do not include gaps or slits as viewed in the Y-axis direction. Thus, the eddy current Ie that flows through the peripheral walls 94 and 104 is not hindered by gaps or slits. This increases the eddy current Ie, which, in turn, increases the damping effect.

(6) The gap 112 is formed between the two distal ends 95 and 105. This limits variations in the opposing distance Y1 of the non-winding side surfaces 62a and 72a from the end walls 93 and 103 caused by dimensional errors of the two parts 91 and 101 and the common mode choke coil 50. Thus, variations are limited in damping effect of the two parts 91 and 101.

More specifically, the damping effect produced by the two parts 91 and 101 varies in accordance with the opposing distance Y1 of the non-winding side surfaces 62a and 72a from the end walls 93 and 103. Thus, there is a need to keep the opposing distance Y1 constant in order to obtain a stable damping effect.

When the two parts 91 and 101 are formed so that the two distal ends 95 and 105 are not spaced apart by the gap 112, the two parts 91 and 101 can be positioned when the two distal ends 95 and 105 come into contact with each other. In this case, the opposing distance Y1 may vary because of dimensional errors of the two parts 91 and 101 and the common mode choke coil 50.

In the present embodiment, the gap 112 is formed between the two distal ends 95 and 105. Thus, the two parts 91 and 101 are not positioned by contact of the two distal ends 95 and 105. This allows the gap 112 to vary in correspondence with the dimensional errors described above to keep the opposing distance Y1 constant. Thus, the advantages described above can be obtained.

(7) The insulator 111 is located between the end walls 93 and 103 and the non-winding side surfaces 62a and 72a. The two parts 91 and 101 are positioned in a state in which the non-winding side surfaces 62a and 72a and the end walls 93 and 103 are in contact with the insulator 111. This allows the opposing distance Y1 to be decreased and improves the damping effect.

(8) The damping unit 90 does not cover the portion of the common mode choke coil 50 corresponding to the gap 112. This may lower the damping effect. In this regard, in the present embodiment, the gap 112 is located at a position corresponding to the central portions 61a and 71a in the extending direction of the long sides 61 and 71 of the ring core 51. The central portions 61a and 71a of the long sides 61 and 71 is where the coils 64 and 74 (i.e., high-density portions 64a and 74a) exist. At such portions, the leakage of magnetic flux is limited. This limits decreases in the damping effect even if the gap 112 is formed between the two distal ends 95 and 105.

(9) The driver 30 is provided with the circuit board 40 that includes the inverter circuit 41 and the low-pass filter circuit 42. The peripheral walls 94 and 104 include the recesses 96 and 106 that extend from the distal ends 95 and 105 toward the end walls 93 and 103 to intermediate positions of the peripheral walls 94 and 104. The first input terminal 65 and the first output terminal 66 that extend from the first coil 64 and the second input terminal 75 and the second output terminal 76 that extend from the second coil 74 are extended through one of the two recesses 96 and 106 and inserted into the terminal holes 40b of the circuit board 40. This electrically connects the common mode choke coil 50 and the circuit board 40.

When just electrically connecting the common mode choke coil 50 and the circuit board 40, the peripheral walls 94 and 104 may include slits extending from the distal ends 95 and 105 to the end walls 93 and 103. However, when the peripheral walls 94 and 104 includes such slits, it will be difficult to form a looped that is closed as viewed in the Y-axis direction in the two parts 91 and 101. This limits the generation of the eddy current Ie in the two parts 91 and 101. In this regard, in the present embodiment, the recesses 96 and 106 extend to intermediate positions of the peripheral walls 94 and 104. Thus, at least the portions of the peripheral walls 94 and 104 corresponding to the side of the end walls 93 and 103 have the form of a closed frame. This forms a closed loop through which the eddy current flows in the peripheral walls 94 and 104 and obtains the damping effect.

The portions of the two peripheral walls 94 and 104 at the side corresponding to the distal ends 95 and 105 contributes less to the damping effect than the portions of the two peripheral walls 94 and 104 at the side corresponding to the end walls 93 and 103 and the end walls 93 and 103 of the two parts 91 and 101. Thus, even when the peripheral walls 94 and 104 include the recesses 96 and 106, the damping effect does not decrease. Accordingly, the common mode choke coil 50 and the circuit board 40 can be electrically connected while decreasing the damping effect.

(10) The terminals 65, 66, 75, and 76 are located closer to the central part of the common mode choke coil 50 than the two non-winding side surfaces 62a and 72a. This allows the recesses 96 and 106 to have smaller dimensions. Thus, the cross-sectional area of the eddy current Ie, which flows in the circumferential direction of the peripheral walls 94 and 104, can be increased. This limits decreases in the damping effect caused by the recesses 96 and 106.

(11) The inverter circuit 41 includes the switching elements Qu1 to Qw2, and the switching elements Qu1 to Qw2 are PWM-controlled to convert DC power to AC power. Further, the cutoff frequency fc of the low-pass filter circuit 42 is set to be lower than the carrier frequency fp, which is the frequency of the carrier signal used to PWM-control the switching elements Qu1 to Qw2. This reduces (attenuates) ripple noise, which results from switching of the switching elements Qu1 to Qw2, with the low-pass filter circuit 42 and limits the ripple noise that is released from the on-board motor-driven compressor 10. More specifically, the low-pass filter circuit 42 functions to reduce the normal mode noise and common mode noise that enters the on-board motor-driven compressor 10 during operation of the PCU 204 and functions to reduce the ripple noise that is released during operation of the on-board motor-driven compressor 10.

When widening the frequency range of the normal mode noise that can be reduced by the low-pass filter circuit 42, the resonant frequency f0 may be set to be higher than the expected frequency range of the normal mode noise to avoid the occurrence of resonance. However, this will also increase the cutoff frequency fc of the low-pass filter circuit 42. Thus, it will be difficult for the cutoff frequency fc to be lower than the carrier frequency fp. Further, a situation in in which the carrier frequency fp increases as the cutoff frequency fc rises is not preferable because this will increase the switching loss of the switching elements Qu1 to Qw2.

In the present embodiment, the damping unit 90 reduces the normal mode noise at frequencies close to the resonant frequency f0. Thus, there is no need to increase the resonant frequency f0 in accordance with the expected frequency range of the normal mode noise. Accordingly, the cutoff frequency fc can be lower than the carrier frequency fp without increasing the carrier frequency fp in excess. This limits the release or ripple noise, which results from the switching of the switching elements Qu1 to Qw2, from the on-board motor-driven compressor 10, without increasing the power loss of the inverter circuit 41.

It should be apparent to those skilled in the art that the present invention may be embodied in many other specific forms without departing from the spirit or scope of the invention. Particularly, it should be understood that the present invention may be embodied in the following forms.

The two parts 91 and 101 may accommodate the common mode choke coil 50 from a diagonal direction that extends orthogonal to the Z-axis direction and intersects both of the X-axis direction and the Y-axis direction. The two parts 91 and 101 may also accommodate the common mode choke coil 50 from the Z-axis direction or from the X-axis direction. The opposing direction in which the openings 92 and 102 oppose each other is not limited to the Y-axis direction and may be any direction.

The first coil 64 does not have to be wound around the first corners 63 and may be wound around only the first long side 61. It is only necessary that at least a portion of the first coil 64 be wound around the first long side 61. The same applies to the second coil 74.

The first coil 64 may be wound around the first short side 62 instead of the first long side 61. In the same manner, the second coil 74 may be wound around the second short side 72 instead of the second long side 71. In this case, the two parts of the damping unit may be coupled to the common mode choke coil 50 from the X-axis direction.

The two coils 64 and 74 may be wound around the entire ring core 51. More specifically, the non-winding portions around which the coils are not wound may be omitted from the ring core 51. In other words, the two coils 64 and 74 may be wound around the side surfaces 62a and 72a of the short sides 62 and 72 that are planes intersecting the Y-axis direction, which is orthogonal to both of the axial direction of the ring core 51 and the opposing direction of the two coils 64 and 74. In this case, the leakage flux Bx has a tendency to concentrate at the side surfaces 62a and 72a.

The ring core 51 may be circular and formed without the corners 63 and 73. In this case, the winding density of the two coils 64 and 74 may be fixed. That is, the coils 64 and 74 do not necessarily have to include both of the high-density portions 64a and 74a and the low-density portions 64b and 74b.

The end walls 93 and 103 and the peripheral walls 94 and 104 may include gaps, slits, or through holes. Further, the two parts 91 and 101 may be at least partially meshed, recessed, embossed, or holed. In this manner, the peripheral walls 94 and 104 do not need to have the form of a completely closed frame.

The two parts 91 and 101 are identical in shape. Instead, for example, the two peripheral walls 94 and 104 may have different dimensions in the Y-axis direction.

The two parts 91 and 101 may include overlapping portions. For example, the distal ends 95 and 105 of the two parts 91 and 101 may be overlapped with each other. In this case, the peripheral wall of one of the two parts 91 and 101 may be larger than that of the other one so that the two distal ends 95 and 105 do not abut against each other. Thus, the gap 112 is not necessary.

The gap 112 does not have to be located at a position corresponding to where the central portions 61a and 71a of the long sides 61 and 71 are located in the Y-axis direction and may be located closer to the central portions 61a and 71a than the two non-winding side surfaces 62a and 72a or any other position.

Instead of the recesses 96 and 106, the end walls 93 and 103 or the peripheral walls 94 and 104 may include through holes. In this case, the terminals 65, 66, 75, and 76 may be extended through the through holes and inserted through the terminal holes 40b of the circuit board 40. Further, the recesses 96 and 106 may be omitted, and the terminals 65, 66, 75, and 76 may be extended through the gap 112.

The non-winding side surfaces 62a and 72a and the end walls 93 and 103 do not have to be in contact with the insulator 111. For example, the non-winding side surfaces 62a and 72a may be spaced apart from the insulator 111. Alternatively, the end walls 93 and 103 may be spaced apart from the insulator 111.

The cover member 31 does not need to have a tubular shape. For example, when the suction housing portion 12 includes an annular rib extending from the end wall 12a in a direction opposite to the side wall 12b, the cover member 31 may be coupled to the suction housing portion 12 in a state contacting the rib. In this case, the end wall 12a, the rib, and the cover member 31 define the accommodation compartment S0. In this manner, the accommodation compartment S0 may be defined by any structure.

The ring core 51 may have any shape and be, for example, a UU core, an EE core, or a toroidal core. The ring core 51 does not need to have the form of a completely closed ring and may include a gap.

The circuit configuration of the low-pass filter circuit 42 is not limited to that of the above embodiment. For example, the low-pass filter circuit 42 may include two X capacitors 80. Further, the low-pass filter circuit may be of any type such as a n-type or a T-type.

The Y capacitors 81 and 82 may be omitted. That is, the driver 30 does not necessarily have to include Y capacitors. Nevertheless, it is preferable that the Y capacitors be included since common noise can be reduced in a suitable manner.

The boost converter 205 may be omitted. In this case, the normal mode noise is, for example, noise resulting from the switching frequency of switching elements of a travel inverter.

The on-board device is not limited to the PCU 204 and may be any device including a switching element that is cyclically activated and deactivated. For example, the on-board device may be an inverter or the like that is separate from the driver 30.

The on-board motor-driven compressor 10 is of an inline type but instead may be of, for example, a camelback type in which the driver 30 is arranged on the outer side of the housing 11 in the radial direction of the rotation shaft 21. In this manner, the driver 30 may be located at any location.

The on-board motor-driven compressor 10 is used with the on-board air-conditioner 200. Instead, for example, when a fuel cell is installed in a vehicle, the on-board motor-driven compressor 10 may be used with an air supply device that supplies air to the fuel cell. In this manner, the compressed subject is not limited to refrigerant and may be any fluid such as air.

The on-board fluid machine is not limited to the on-board motor-driven compressor 10 that includes the compression unit 22 and may be any device. For example, when the vehicle provided with the on-board fluid machine is a fuel cell vehicle, the on-board fluid machine may be an on-board electric pump that supplies hydrogen to the fuel cell.

The modified examples may be combined with each other or with the above embodiment.

One aspect that can be acknowledged from the above embodiment and the modified examples will now be described.

(A) An on-board fluid machine including:

a housing configured to allow fluid to flow into the housing;

an electric motor accommodated in the housing; and a driver that is supplied with DC power and drives the electric motor, wherein the driver includes a low-pass filter circuit configured to reduce common mode noise and normal mode noise that are included in the DC power, and an inverter circuit configured to convert the DC power, from which the common mode noise and the normal mode noise have been reduced, to AC power, wherein the low-pass filter circuit includes a common mode choke coil including a ring core and a first coil and a second coil that are wound around the ring core, and a capacitor electrically connected to the common mode choke coil, wherein the driver further includes a damping unit including a first part and a second part, wherein the first part is box-shaped and includes a first opening, the second part is box-shaped and includes a second opening, the first part and the second part are located at positions penetrated by leakage flux that is produced at the common mode choke coil, the first part and the second part are configured so that the penetration of the leakage current through the first part and the second part generates a flow of eddy current, and the first part and the second part cooperate to accommodate the common mode choke coil in a state in which the first opening and the second opening are opposed to each other.

The phrase of "the first part and the second part are configured so that the penetration of the leakage current through the first part and the second part generates a flow of eddy current" indicates that, for example, the first part and the second part are formed from a non-magnetic conductive material.

The present examples and embodiments are to be considered as illustrative and not restrictive, and the invention is not to be limited to the details given herein, but may be modified within the scope and equivalence of the appended claims.

The invention claimed is:

1. An on-board fluid machine comprising:

a housing configured to allow fluid to flow into the housing;

an electric motor accommodated in the housing; and a driver that is supplied with DC power and drives the electric motor, wherein the driver includes a low-pass filter circuit configured to reduce common mode noise and normal mode noise that are included in the DC power, and an inverter circuit configured to convert the DC power, from which the common mode noise and the normal mode noise have been reduced, to AC power, wherein the low-pass filter circuit includes a common mode choke coil including a ring core and a first coil and a second coil that are wound around the ring core, and a capacitor electrically connected to the common mode choke coil, the driver further includes a damping unit located at a position where magnetic field lines produced by the common mode choke coil generate eddy current, the damping unit includes a first part and a second part, wherein the first part is box-shaped and includes a first opening, and the second part is box-shaped and includes a second opening, and the first part and the second part cooperate to accommodate the common mode choke coil in a state in which the first opening and the second opening are opposed to each other.

2. The on-board fluid machine according to claim 1, wherein the first coil and the second coil are opposed to each other in a first direction that is orthogonal to an axial direction of the ring core, and the first part and the second part accommodate the common mode choke coil from a second direction that is orthogonal to the axial direction and intersects the first direction.

3. The on-board fluid machine according to claim 2, wherein
the ring core includes a first extension and a second extension that extend in an extending direction that is orthogonal to both of the axial direction and the first direction,
the first coil is at least partially wound around the first extension,
the second coil is at least partially wound around the second extension,
the ring core includes two outer end surfaces in the extending direction defining a first non-winding side surface and a second non-winding side surface around which the first coil and the second coil are not wound,
the first part further includes
a first end wall that covers the first non-winding side surface, and
a first peripheral wall extending from the first end wall toward the second part and including a first distal end that defines the first opening, wherein the first peripheral wall is frame-shaped and surrounds the common mode choke coil as viewed in the extending direction, and
the second part further includes
a second end wall that covers the second non-winding side surface, and
a second peripheral wall extending from the second end wall toward the first part and including a second distal end that defines the second opening, wherein the second peripheral wall is frame-shaped and surrounds the common mode choke coil as viewed in the extending direction.

4. The on-board fluid machine according to claim 3, wherein the first distal and the second distal end are spaced apart by a gap.

5. The on-board fluid machine according to claim 4, wherein
the driver is provided with a circuit board that includes the inverter circuit and the low-pass filter circuit,
the first peripheral wall includes a first recess extending from the first distal end toward the first end wall to an intermediate position of the first peripheral wall,
the second peripheral wall includes a second recess extending from the second distal end toward the second end wall to an intermediate position of the second peripheral wall,
the first coil and the second coil each include a terminal extended through the first recess or the second recess and inserted through a terminal hole in the circuit board.

6. The on-board fluid machine according to claim 4, wherein the gap is located at a position corresponding to central portions of the first and second extensions in the extending direction.

7. The on-board fluid machine according to claim 3, wherein the driver further includes an insulator that insulates the common mode choke coil and the damping unit, the first part is positioned in a state in which the first non-winding side surface and the first end wall are in contact with the insulator, and the second part is positioned in a state in which the second non-winding side surface and the second end wall are in contact with the insulator.

8. The on-board fluid machine according to claim 1, wherein the first part and the second part are located at a position where leakage flux produced at the common mode choke coil penetrates, and the leakage flux penetrates the first part and the second part to generate a flow of eddy current.

9. The on-board fluid machine according to claim 1, wherein the on-board fluid machine is an on-board motor-driven compressor including a compression unit driven by the electric motor and configured to compress the fluid that enters the housing.

* * * * *